US010121878B1

(12) United States Patent
Ciavatti et al.

(10) Patent No.: US 10,121,878 B1
(45) Date of Patent: Nov. 6, 2018

(54) LDMOS FINFET STRUCTURES WITH MULTIPLE GATE STRUCTURES

(71) Applicant: GLOBALFOUNDRIES Inc., Grand Cayman (KY)

(72) Inventors: Jerome Ciavatti, Mechanicville, NY (US); Jagar Singh, Clifton Park, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/711,415

(22) Filed: Sep. 21, 2017

(51) Int. Cl.
| | |
|---|---|
| *H01L 29/66* | (2006.01) |
| *H01L 29/78* | (2006.01) |
| *H01L 29/423* | (2006.01) |
| *H01L 29/08* | (2006.01) |
| *H01L 21/441* | (2006.01) |
| *H01L 29/06* | (2006.01) |
| *H01L 21/266* | (2006.01) |

(52) U.S. Cl.
CPC ...... *H01L 29/66689* (2013.01); *H01L 21/266* (2013.01); *H01L 21/441* (2013.01); *H01L 29/063* (2013.01); *H01L 29/0653* (2013.01); *H01L 29/0852* (2013.01); *H01L 29/4232* (2013.01); *H01L 29/7816* (2013.01); *H01L 29/7835* (2013.01)

(58) Field of Classification Search
CPC ............. H01L 29/66681; H01L 29/063; H01L 29/7816

USPC .......................................................... 257/343
See application file for complete search history.

(56) References Cited

U.S. PATENT DOCUMENTS

| | | | |
|---|---|---|---|
| 6,876,035 | B2 | 4/2005 | Abadeer et al. |
| 7,405,443 | B1 | 7/2008 | Zuniga et al. |
| 8,716,791 | B1 | 5/2014 | Iravani et al. |
| 9,041,127 | B2 | 5/2015 | Campi, Jr. et al. |
| 2003/0001198 | A1 | 1/2003 | Bromberger et al. |
| 2007/0228425 | A1 | 10/2007 | Miller et al. |
| 2010/0096697 | A1 | 4/2010 | Su et al. |
| 2010/0207233 | A1 | 8/2010 | Gambino et al. |
| 2014/0015048 | A1 | 1/2014 | Ng et al. |
| 2015/0035053 | A1 | 2/2015 | Singh |
| 2018/0061981 | A1* | 3/2018 | Zhou ............. H01L 29/66681 |

* cited by examiner

*Primary Examiner* — Mark Prenty
(74) *Attorney, Agent, or Firm* — Thompson Hine LLP; Anthony Canale

(57) ABSTRACT

Field-effect transistor structures for a laterally-diffused metal-oxide-semiconductor (LDMOS) device and methods of forming a LDMOS device. First and second fins are formed on a substrate. A first well of a first conductivity type is arranged partially in the substrate and partially in the first fin. A second well of a second conductivity type is arranged partially in the substrate, partially in the first fin, and partially in the second fin. First and second source/drain regions of the second conductivity type are respectively formed within the first well in the first fin and within the second well in the second fin. Spaced-apart gate structures are formed that overlap with respective portions of the first fin. A doped region of the first conductivity type is arranged within the second well in the first fin between the first and second gate structures.

20 Claims, 2 Drawing Sheets

LDMOS FINFET STRUCTURES WITH MULTIPLE GATE STRUCTURES

BACKGROUND

The present invention relates to semiconductor device fabrication and integrated circuits and, more specifically, to field-effect transistor structures for a laterally-diffused metal-oxide-semiconductor (LDMOS) device and methods of forming a LDMOS device.

Device structures for a field-effect transistor generally include a body region, a source and a drain defined in the body region, and a gate electrode configured to switch carrier flow in a channel formed during operation in the body region. When a control voltage exceeding a designated threshold voltage is applied to the gate electrode, carrier flow occurs in an inversion or depletion layer in the channel between the source and drain to produce a device output current.

A fin-type field-effect transistor (FinFET) is a non-planar device structure that may be more densely packed in an integrated circuit than planar field-effect transistors. A FinFET may include a fin consisting of a solid unitary body of semiconductor material, heavily-doped source/drain regions formed in sections of the body, and a gate electrode that wraps about a channel located in the fin body between the source/drain regions. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

High-voltage integrated circuits used, for example, in microwave/RF power amplifiers typically require specialized circuit technology capable of withstanding higher voltages. Laterally-diffused metal oxide semiconductor (LDMOS) devices are designed to handle higher voltages than logic field-effect transistors.

Improved field-effect transistor structures for a LDMOS device and methods of forming a LDMOS device are needed.

SUMMARY

In an embodiment of the invention, a structure is provided for a field-effect transistor. The structure includes first and second fins on a substrate, a first well that is arranged partially in the substrate and partially in the second fin, and a second well that is arranged partially in the substrate, partially in the first fin, and partially in the second fin. The first well has a first conductivity type, and the second well has a second conductivity type. The structure further includes a first source/drain region of the second conductivity type within the first well in the first fin, and a second source/drain region of the second conductivity type within the second well in the second fin. A first gate structure is arranged to overlap with a first portion of the first fin, and a second gate structure is arranged to overlap with a second portion of the first fin. The second gate structure is spaced along the first fin from the first gate structure. A doped region is arranged within the second well in the first fin between the first gate structure and the second gate structure, and has the first conductivity type.

In an embodiment of the invention, a method is provided for fabricating a field-effect transistor. The method includes forming first and second fins on a substrate, forming a first well that is arranged partially in the substrate and partially in the first fin, and forming a second well that is arranged partially in the substrate, partially in the first fin, and partially in the second fin. The first well has a first conductivity type, and the second well has a second conductivity type. A first source/drain region of the second conductivity type is formed within the first well in the first fin, and a second source/drain region of the second conductivity type is formed within the second well in the second fin. A first gate structure is formed that overlaps with a first portion of the first fin, and a second gate structure is formed that overlaps with a second portion of the first fin. The second gate structure is spaced along the first fin from the first gate structure. A doped region is formed within the second well in the first fin between the first gate structure and the second gate structure, and has the first conductivity type.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
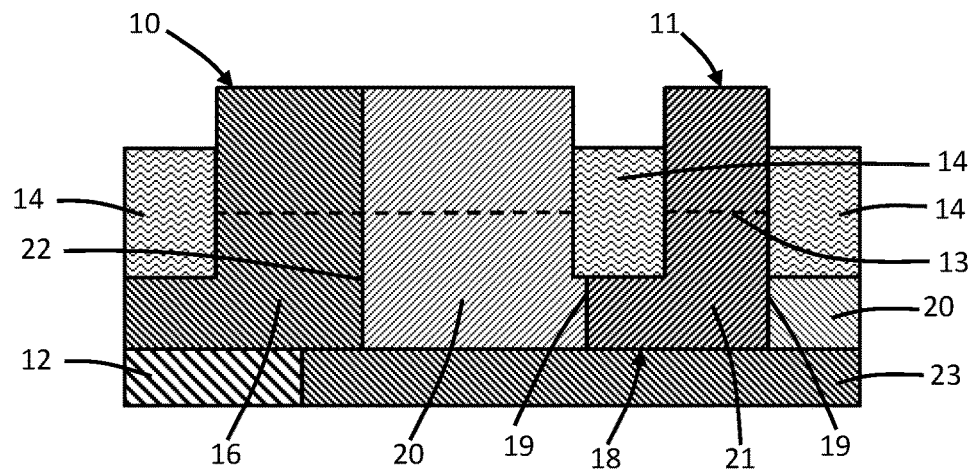
FIGS. 1-3 are cross-sectional views of a device structure at successive fabrication stages of a processing method in accordance with embodiments of the invention.

With reference to FIG. 1 and in accordance with embodiments of the invention, a fin 10 and a fin 11 each project in a vertical direction relative to a substrate 12, such as a bulk single-crystal silicon substrate. The fins 10, 11 are three-dimensional bodies composed of a semiconductor material, such as silicon. The transition from the fins 10, 11 to the top surface 13 of the substrate 12 is indicated diagrammatically by the dashed lines in FIG. 1. The fins 10, 11 therefore seamlessly adjoin the substrate 12 at its top surface 13, and have respective heights, which may be equal, measured in a vertical direction relative to the top surface 13 of the substrate 12.

The fins 10, 11 may be formed by patterning the substrate 12 or an epitaxial layer grown on the substrate 12 using a sidewall imaging transfer (SIT) process or self-aligned double patterning (SADP) in which shallow trenches are etched into the substrate 12 and filled with a dielectric material, such as an oxide of silicon (e.g., $SiO_2$) deposited by chemical vapor deposition (CVD), and planarized with chemical mechanical polishing (CMP) to form shallow trench isolation regions (not shown). After the fins 10, 11 and shallow trench isolation regions are formed, deep trench isolation regions 14 are formed that are arranged around and between the fins 10, 11. The deep trench isolation regions 14 may be formed by etching deep trenches through the fins 10, 11 and shallow trench isolation into the substrate 12 and filling the deep trenches with a dielectric material, such as an oxide of silicon (e.g., $SiO_2$) deposited by CVD and planarized with CMP. The dielectric material of the shallow trench isolation regions and the dielectric material of the deep trench isolation regions 14 are etched back to reveal respective portions of the fins 10, 11 arranged above the respective recessed top surfaces of the dielectric materials.

Other portions of the fins 10, 11 are embedded in the shallow trench isolation regions and the deep trench isolation regions 14.

A well 16 and a well 18 are formed in the fins 10, 11 and the substrate 12. The well 16, which is located partially in the fin 10 and partially in substrate 12, is composed of semiconductor material having an opposite conductivity type from the well 18. The well 18 is located partially in the fin 10, partially in fin 11, and partially in substrate 12. Specifically, the well 18 includes a doped region 21 that is located in the substrate 12 and fin 11, as well as a moat region 20 that is located in the substrate 12 and fin 10. The moat region 20, which is composed of semiconductor material having the same conductivity type as the doped region 21, is more lightly doped (i.e., has a lower dopant concentration) than the doped region 21 of the well 18.

The moat region 20 of the well 18 is arranged between the well 16 and the doped region 21 of the well 18. The moat region 20 adjoins the well 16 along an interface that defines a p-n junction 22 and adjoins the doped region 21 of well 18 along an interface 19. The interface 19 and p-n junction 22 may be oriented in a vertical direction. In an embodiment, the interface 19 is located directly beneath the deep trench isolation regions 14. In an embodiment, the moat region 20 of the well 18 may surround the doped region 21 of the well 18 such that the interface 19 extends about the perimeter of the doped region 21.

The well 16 may be formed by introducing a dopant by, for example, ion implantation that introduces a concentration of a dopant in the substrate 12 and fin 10. The doped region 21 of the well 18 may be formed by introducing a concentration of a different dopant of opposite conductivity type in the substrate 12 and fin 11. Respective patterned implantation masks may be used to define selected areas exposed for the implantations. The implantation mask used to select the exposed area for forming well 16 is stripped after the associated implantation, and before forming the implantation mask used to form the doped region 21 of the well 18. Similarly, the implantation mask used to select the exposed area for forming the doped region 21 of the well 18 is stripped after the associated implantation is performed. The implantation masks may include a layer of a light-sensitive material, such as an organic photoresist, applied by a spin coating process, pre-baked, exposed to light projected through a photomask, baked after exposure, and developed with a chemical developer. The implantation masks used to form well 16 and to form the doped region 21 of the well 18 have a thickness and stopping power sufficient to block selected masked areas of the fins 10, 11 and substrate 12 against receiving doses of the implanted ions.

The implantation conditions (e.g., ion species, dose, kinetic energy) may be selected to tune the electrical and physical characteristics (e.g., electrical resistivity and depth profile) of the well 16. Similarly, the implantation conditions may be selected to tune the electrical and physical characteristics of the doped region 21 of the well 18. In an embodiment, the semiconductor material of well 16 may be doped with an n-type dopant from Group V of the Periodic Table (e.g., phosphorus (P) and/or arsenic (As)) effective to provide n-type conductivity. In an embodiment, the semiconductor material of the doped region 21 of the well 18 may be doped with a p-type dopant selected from Group III of the Periodic Table (e.g., boron) effective to provide p-type conductivity.

The moat region 20 of the well 18 has a lighter dopant concentration than the doped region 21 of the well 18. In an embodiment, the moat region 20 may be formed by introducing a concentration of a dopant by ion implantation into the fin 10 and substrate 12. In an embodiment, the moat region 20 may be a section of a lightly-doped substrate 12. In either embodiment, the moat region 20 is masked by the implantation masks used to subsequently form the well 16 and the doped region 21 of the well 18, which establishes locations of the interface 19 and the p-n junction 22 relative to the moat region 20. The implantation masking when forming the doped region 21 of the well 18 and arrangement of the deep trench isolation regions 14 may be selected such that the moat region 20 surrounds the well 18.

A doped region 23 of the same conductivity type as the well 18 or an opposite conductivity type from the well 18 may be formed in the substrate 12. The doped region 23 electrically isolates the doped region 21 and moat region 20 of the well 18 from the substrate 12.

Figure 2:
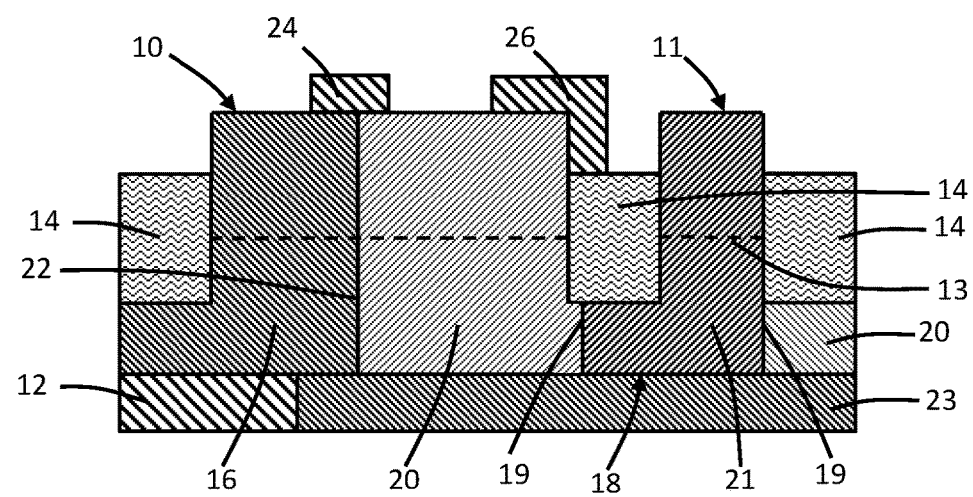

With reference to FIG. 2 in which like reference numerals refer to like features in FIG. 1 and at a subsequent fabrication stage, gate structures 24, 26 are formed that extend across and overlap with different portions of the fin 10 and shallow trench isolation. The gate structure 26 also extends onto and overlaps in part with the deep trench isolation region 14 between the fins 10, 11. The gate structures 24, 26 may be formed by depositing a layer stack of different component materials and patterning the deposited layer stack with photolithography and etching. The gate structures 24, 26 may include a gate electrode composed of a conductor, such as a metal, doped polycrystalline silicon (polysilicon), or a layered stack of these and other conductive materials, and an electrical insulator including, but not limited to, silicon dioxide ($SiO_2$), a high-k dielectric material such as hafnium oxide ($HfO_2$), or layered stacks of these and other dielectric materials. The electrical insulator is arranged between the conductor and the exterior surfaces of the fin 10. In an embodiment, the gate structures 24, 26 may be functional gate structures that are permanent gate structures used to control output current (i.e., flow of carriers in the channel) of a field-effect transistor. In an embodiment, the gate structures 24, 26 may be sacrificial gate structures that are placeholder structure for functional gate structures to be subsequently formed in a replacement metal gate process. The gate structures 24, 26 or the functional gate structures replacing the gate structures 24, 26 may be shorted together by wiring in the middle-of-line and/or back-end-of-line interconnect structure.

Source/drain regions 28, 30 of the same conductivity type are respectively formed as doped regions in the fin 10 and in the fin 11. The source/drain region 28 is arranged in a portion of the well 16 in fin 10, and is composed of heavily-doped semiconductor material having an opposite conductivity type from the well 16. The source/drain region 30 is arranged in a portion of the doped region 21 of the well 18 in fin 11, and is composed of heavily-doped semiconductor material having the same conductivity type as the doped region 21 of the well 18 at a higher dopant concentration. The source/drain regions 28, 30 may be formed by etching the fins 10, 11 and epitaxially growing a doped semiconductor material in the respective etched volumes of the fins 10, 11. In an embodiment in which the well 16 is n-type semiconductor material and the well 18 is p-type semiconductor material, the semiconductor material constituting the source/drain regions 28, 30 may be doped with a p-type dopant to provide p-type conductivity and may be heavily doped with a concentration of the p-type dopant.

Figure 3:
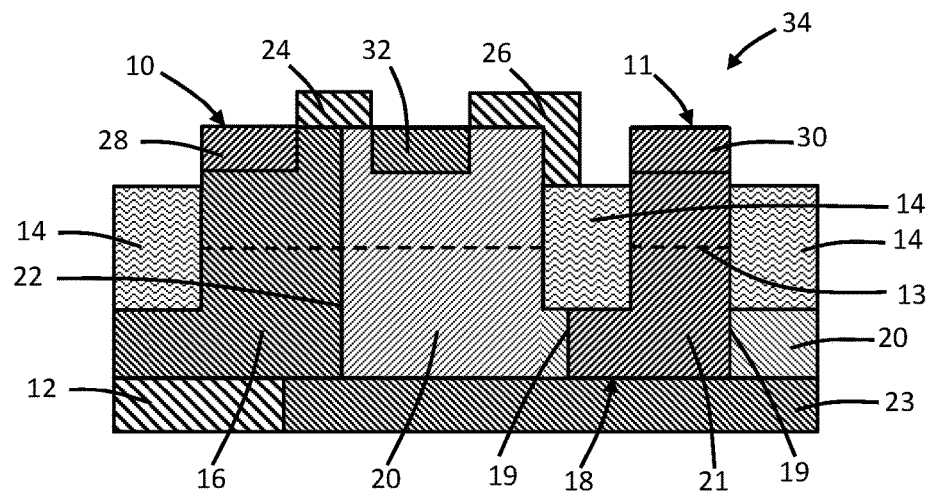

With reference to FIG. 3 in which like reference numerals refer to like features in FIG. 2 and at a subsequent fabrication stage, a doped region 32 is formed that is positioned within the moat region 20 in the fin 10 at a location arranged between the gate structure 24 and the gate structure 26. The doped region 32 is composed of semiconductor material having an opposite conductivity type from the moat region 20, and also having an opposite conductivity type from the source/drain regions 28, 30. The doped region 32 may be directly coupled with the moat region 20 of opposite conductivity type to form a junction. The doped region 32 may be formed by etching the fin 10 and epitaxially growing a doped semiconductor material in the etched volume of the fin 10. In an embodiment in which the moat region 20 is p-type semiconductor material, the semiconductor material of the doped region 32 may be doped with an n-type dopant (e.g., phosphorus (P) and/or arsenic (As)) to provide n-type conductivity, and may be heavily doped with a concentration of the n-type dopant. The doped region 32 may be formed either before or after the source/drain regions 28, 30.

As used herein, heavily-doped semiconductor material may be considered to have a dopant concentration that is at least an order of magnitude higher than the dopant concentration in lightly-doped semiconductor material. For example, a representative dopant concentration for heavily-doped semiconductor material may be greater than or equal to $10^{18}$ cm$^{-3}$, and a representative dopant concentration for lightly-doped semiconductor material may be less than or equal to $10^{16}$ cm$^{-3}$.

The resulting field-effect transistor 34 includes the fins 10, 11, the wells 16, 18, the gate structures 24, 26, and the source/drain regions 28, 30. The well 16 operates as a channel region during device operation. The gate structure 24 controls the channel of the field-effect transistor 34 during device operation. The gate structure 26, which extends onto and overlaps in part with the deep trench isolation region 14 between the fins 10, 11, may provide electric field plating during operation of the field-effect transistor 34. The moat region 20 and doped region 21 of the well 18 that are arranged between the p-n junction 22 and the source/drain region 30 collectively constitute a drain extension or drift region of the field-effect transistor 34.

The moat region 20 and the doped region 32 represent additional features not found in conventional LDMOS device structures. The presence of the moat region 20 has the effect of increasing the breakdown voltage of the field-effect transistor 34. The doped region 32 provides a floating junction with the moat region 20 that can be used to deplete the moat region 20 vertically in the fin 10 while the source-to-drain voltage is zero volts.

Middle-of-line (MOL) processing and back-end-of-line (BEOL) processing follow, which includes formation of contacts and wiring for a local interconnect structure, and formation of dielectric layers, via plugs, and wiring for a BEOL interconnect structure coupled by the local interconnect structure with the field-effect transistor 34.

Figure 4:
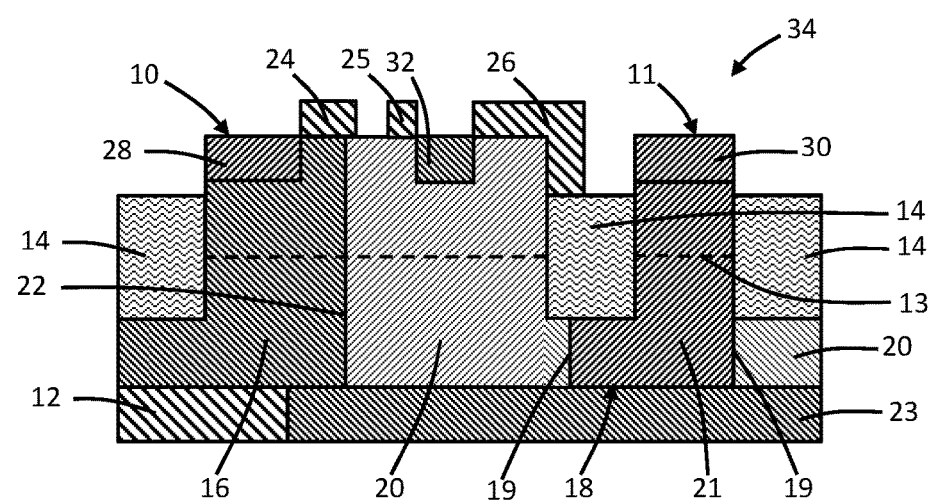
FIG. 4 is a cross-sectional view of a device structure in accordance with alternative embodiments of the invention.

With reference to FIG. 4 in which like reference numerals refer to like features in FIG. 3 and in accordance with alternative embodiments of the invention, an additional gate structure 25 may be formed between the gate structure 24 and the gate structure 26. The doped region 32 is arranged along the fin 10 between the gate structure 25 and the gate structure 26. The result is that the doped region 32 is shifted further away from the channel region formed in the well 16 during device operation. The use of more than one gate structure 24, 25 effectively forms a stacked logic field-effect transistor feeding the high voltage drain at source/drain region 30.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to or with another element if intervening elements are absent. A feature may be "indirectly connected" or "indirectly coupled" to or with another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor that is formed using a substrate, the structure comprising:
    a first fin and a second fin on the substrate;
    a first well that is arranged partially in the substrate and partially in the first fin, the first well having a first conductivity type;
    a second well that is arranged partially in the substrate, partially in the first fin, and partially in the second fin, the second well having a second conductivity type;
    a first source/drain region of the second conductivity type within the first well in the first fin;
    a second source/drain region of the second conductivity type within the second well in the second fin;
    a first gate structure arranged to overlap with a first portion of the first fin;
    a second gate structure arranged to overlap with a second portion of the first fin, the second gate structure spaced along the first fin from the first gate structure; and
    a doped region arranged within the second well in the first fin between the first gate structure and the second gate structure, the doped region having the first conductivity type.

2. The structure of claim 1 wherein the second well includes a first region and a second region in which the second source/drain region is arranged, the first region of the second well is arranged partially in the first fin and partially in the substrate between the first well and the second region of the second well, and the second region of the second well is located in the second fin.

3. The structure of claim 2 wherein the first well and the first region of the second well converge along a junction, and the first region of the second well separates the first well from the second region of the second well.

4. The structure of claim 3 wherein the first gate structure overlies the junction between the first well and the first region of the second well.

5. The structure of claim 4 further comprising:
a trench isolation region between the first fin and the second fin,
wherein the first region of the second well and the second region of the second well converge beneath the trench isolation region.

6. The structure of claim 2 wherein the first region of the second well is doped with a first concentration of a dopant providing the second conductivity type, the second region of the second well is doped with a second concentration of the dopant providing the second conductivity type, and the second concentration is greater than the first concentration.

7. The structure of claim 2 wherein the doped region is coupled with the first region of the second well.

8. The structure of claim 7 further comprising:
a trench isolation region between the first fin and the second fin,
wherein the second gate structure is arranged between the doped region and the trench isolation region.

9. The structure of claim 2 wherein the first region of the second well surrounds the second region of the second well.

10. The structure of claim 1 further comprising:
a third gate structure overlapping a third portion of the first fin, the third gate structure spaced along the first fin from the first gate structure, and the first gate structure and the third gate structure are arranged between the first source/drain region and the doped region.

11. The structure of claim 1 wherein the doped region is not contacted.

12. The structure of claim 1 further comprising:
a trench isolation region between the first fin and the second fin,
wherein a portion of the second gate structure has an overlapping relationship with the trench isolation region.

13. The structure of claim 1 wherein the first conductivity type is n-type conductivity, and the second conductivity type is p-type conductivity.

14. A method of fabricating a field-effect transistor, the method comprising:
forming a first fin and a second fin on a substrate;
forming a first well that is arranged partially in the substrate and partially in the first fin, the first well having a first conductivity type;
forming a second well that is arranged partially in the substrate, partially in the first fin, and partially in the second fin, the second well having a second conductivity type;
forming a first source/drain region of the second conductivity type within the first well in the first fin;
forming a second source/drain region of the second conductivity type within the second well in the second fin;
forming a first gate structure that overlaps with a first portion of the first fin;
forming a second gate structure that overlaps with a second portion of the first fin, the second gate structure is spaced along the first fin from the first gate structure; and
forming a doped region arranged within the second well in the first fin between the first gate structure and the second gate structure, the doped region having the first conductivity type.

15. The method of claim 14 wherein the second well includes a first region and a second region in which the second source/drain region is arranged, the first region of the second well is arranged partially in the first fin and partially in the substrate between the first well and the second region of the second well, and the second region of the second well is located in the second fin.

16. The method of claim 15 wherein the first well and the first region of the second well converge along a junction, and the first region of the second well separates the first well from the second region of the second well.

17. The method of claim 15 wherein the doped region is directly coupled with the first region of the second well, and the first region of the second well is more lightly doped than the second region of the second well.

18. The method of claim 17 further comprising:
forming a trench isolation region arranged between the first fin and the second fin,
wherein a portion of the second gate structure has an overlapping relationship with the trench isolation region, and the second gate structure is arranged between the doped region and the trench isolation region.

19. The method of claim 17 further comprising:
forming a third gate structure overlapping a third portion of the first fin,
wherein the third gate structure is spaced along the first fin from the first gate structure, and the first gate structure and the third gate structure are arranged between the first source/drain region and the doped region.

20. The method of claim 14 further comprising:
forming a trench isolation region between the first fin and the second fin,
wherein a portion of the second gate structure has an overlapping relationship with the trench isolation region.

* * * * *